(12) United States Patent
Ozeki et al.

(10) Patent No.: US 6,316,300 B1
(45) Date of Patent: Nov. 13, 2001

(54) METHOD OF MANUFACTURING A SEMICONDUCTOR DEVICE HAVING AN OXIDATION PROCESS FOR SELECTIVELY FORMING AN OXIDE FILM

(75) Inventors: Yoshihiko Ozeki, Kariya; Yoshifumi Okabe, Anjo; Takeshi Fukazawa, Nagoya; Hisanori Yokura, Chiryu, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/392,237

(22) Filed: Sep. 8, 1999

(30) Foreign Application Priority Data

Sep. 16, 1998 (JP) .................................. 10-261622
Aug. 20, 1999 (JP) .................................. 11-234006

(51) Int. Cl.⁷ ...................... H01L 21/336; H01L 21/8234
(52) U.S. Cl. .......................................... 438/197; 438/270
(58) Field of Search ..................... 438/197, 137, 438/138, 268, 269, 270, 271, 316; 257/329, 330

(56) References Cited

U.S. PATENT DOCUMENTS

| 5,151,381 | 9/1992 | Liu et al. . |
|---|---|---|
| 5,316,959 | 5/1994 | Kwan et al. . |
| 5,460,985 | 10/1995 | Tokura et al. . |
| 5,470,770 | 11/1995 | Takahashi et al. . |
| 5,698,880 | 12/1997 | Takahashi et al. . |
| 5,714,781 | * 2/1998 | Yamamoto et al. .................. 257/329 |
| 5,747,851 | 5/1998 | Tomatsu et al. . |
| 5,776,812 | 7/1998 | Takahashi et al. . |
| 5,780,324 | 7/1998 | Tokura et al. . |
| 5,894,059 | * 4/1999 | Peidous ................................ 438/316 |
| 5,925,911 | 7/1999 | Okabe et al. . |
| 6,015,737 | * 1/2000 | Tokura ................................ 438/270 |

FOREIGN PATENT DOCUMENTS

| 60-028271 | 2/1985 | (JP) . |
|---|---|---|
| 62-012167 | 1/1987 | (JP) . |
| 8-298322 | 11/1996 | (JP) . |
| 10-107276 | 4/1998 | (JP) . |
| 2843037 | 10/1998 | (JP) . |
| 2870472 | 1/1999 | (JP) . |

* cited by examiner

*Primary Examiner*—David Nelms
*Assistant Examiner*—Dung A Le
(74) *Attorney, Agent, or Firm*—Pillsbury Winthrop LLP

(57) ABSTRACT

A method of manufacturing of a semiconductor device having a thermal oxidation process for selectively forming an oxide film by a thermal oxidation, which can reduce the generation of lattice defects in the semiconductor device during the thermal oxidation process. A groove portion LOCOS oxide film is formed in a groove portion of a semiconductor substrate by first and second wet oxidation steps. At the first wet oxidation step, a thin oxide film is formed on an exposed surface of an epitaxial layer by performing a wet oxidation through an opening portion made of silicon nitride under an oxidation temperature of approximately 875° C. At the second wet oxidation step, the oxidation temperature is risen to approximately 1050° C. to advance the oxidation of the epitaxial layer to finally form the groove portion LOCOS oxide film having a thickness of approximately 950 nm. Lattice defects due to the dislocation is reduced by largely releasing the thermal stress generated at the semiconductor substrate portion corresponding to the edges of the groove portion LOCOS oxide film. Therefore, it can reduce the generation of lattice defects in the semiconductor device during the thermal oxidation process.

20 Claims, 10 Drawing Sheets

FIG. IA
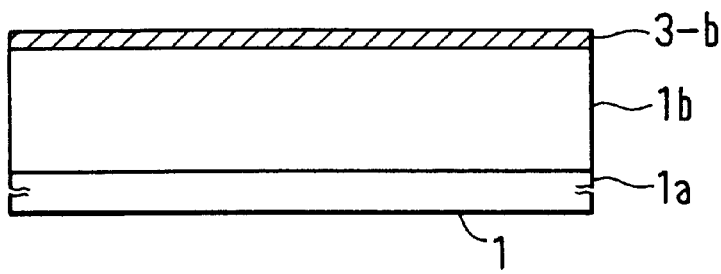
FIG. IB
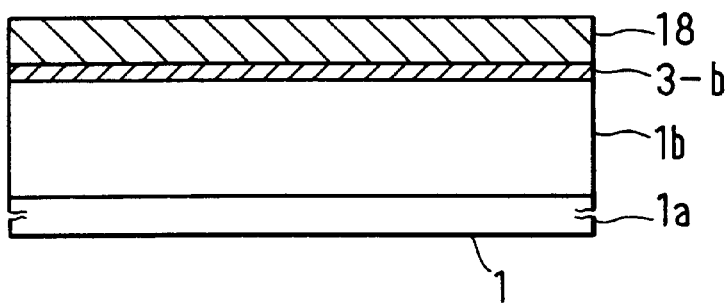
FIG. IC
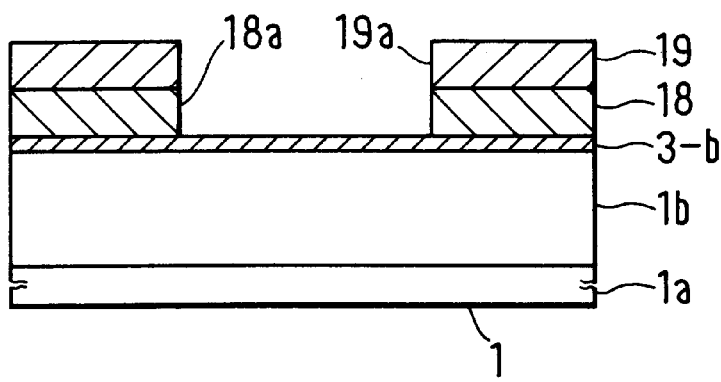
FIG. ID
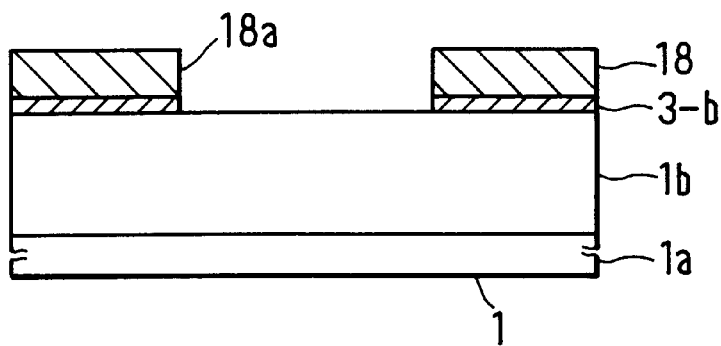

7  5 b  a

METHOD OF MANUFACTURING A SEMICONDUCTOR DEVICE HAVING AN OXIDATION PROCESS FOR SELECTIVELY FORMING AN OXIDE FILM

CROSS REFERENCE TO RELATED APPLICATION

This application is based upon Japanese Patent Application Nos. Hei. 10-261622 filed on Sep. 16, 1998 and Hei. 11-234006 filed on Aug. 20, 1999, the contents of which are incorporated herein by reference.

BACKGROUND OF THE INVENTION

1. Field of the Invention

This invention relates to a method of manufacturing a semiconductor device, and especially to a method of manufacturing a semiconductor device having a step of selectively forming an oxide film by a thermal oxidation, and can be used for, for example, a method of manufacturing a power semiconductor device such as a vertical type MOSFET (Metal Oxide Semiconductor Field Effect transistor) or an IGBT (Integrated Gate Bipolar Transistor) in which a portion where the oxide film is formed is used as a channel forming region.

2. Related Art

A conventional vertical type power MOSFET having a concave structure is disclosed in Japanese Patent Application Laid-open No. Hei. 8-236766 (U.S. Pat. No. 5,776,812). According to this vertical type power MOSFET, a plurality of channel wells are formed on a surface of a semiconductor substrate, U-groove is formed in crosswise around the channel wells, and channel region is to be formed along sidewall of the U-groove of each channel wells. Here, the semiconductor substrate is formed by an N-type silicon substrate having an orientation of (100) and N-type epitaxial layer grown on the N-type silicon substrate. The channel wells are formed as P-type wells.

The manufacturing steps of such a vertical type MOSFET include the following steps. That is, it includes: mask forming step for forming a silicon nitride film having an opening having a grid-shaped pattern as a mask member on the semiconductor substrate at a region where the U-grove is to be formed; groove forming step for forming the grid-shaped U-groove on the semiconductor substrate by performing an isotropic etching (chemical dry etching) on the semiconductor substrate through the opening of the silicon nitride; oxide film forming step for forming a groove portion LOCOS oxide film to be filled in the U-groove by a thermal oxidation using the silicon nitride film as a mask; and channel well forming step for forming a channel well by implanting impurities by using the groove portion LOCOS as a mask by a self-alignment implantation.

In the conventional oxide film forming step, the groove portion LOCOS oxide film as a thick oxide film is formed by rapidly oxidizing a surface of the semiconductor substrate by a long time thermal oxidation under a relatively high temperature higher than 1000° C. (generally, 1050° C.). However, when such the oxide film forming step is adopted, as shown in FIG. 7, it is found that numerous pits corresponding to lattice defects are generated at peripheral regions of the channel wells (shown as "b") of the U-groove (shown as "a"). These lattice defects cause decreasing of a yield of manufacturing the vertical type MOSFET. Here, FIG. 7 is a schematic diagram showing a photograph of the surface of the semiconductor substrate wherein a Secco etching ($K_2Cr_2O_7$=2.25 grams per HF=100 cc, $H_2O$=50 cc) is performed after disposing the surface of the semiconductor substrate having passed each steps including the oxide film forming step (Note that the thermal oxidation in the oxide film forming step is a wet oxidation using a water vapor as an oxidizing agent). In FIG. 7, a line type pit "A" is caused by an OSF (Oxidation induced Stacking Fault), and a dot type pit "B" is caused by a dislocation.

It is estimated that the OSF is mainly caused by a heavy-metals pollution in a manufacturing equipment such as a dray etching reactor or an oxidation reactor, and dislocation is mainly caused by a thermal stress generated at regions corresponding to edge portions of the groove portion LOCOS oxide film in the semiconductor substrate during the thermal oxidation process.

Here, the OSF may be reduced by reducing heavy-metals to be attached in the reactor during the etching process of the semiconductor substrate, or thoroughly washing the semiconductor substrate before the thermal oxidation process, however, the dislocation can not be reduced by these measures.

SUMMARY OF THE INVENTION

This invention has been conceived in view of the background thus far described and its first object is to provide a method of manufacturing of a semiconductor device having a thermal oxidation process for selectively forming an oxide film by a thermal oxidation, which can reduce the generation of lattice defects in the semiconductor device during the thermal oxidation process.

According to the present invention, first wet oxidation step oxidizes a semiconductor substrate through an opening of a mask by a wet thermal oxidation at a first oxidation temperature; and second wet oxidation step further oxidizes the semiconductor substrate through the opening of the mask by a wet thermal oxidation at a second oxidation temperature higher than the first oxidation temperature. In this case, lattice defects due to dislocation are reduced because thermal stress generated at the semiconductor substrate where corresponding to an edges of a oxide film in the groove portion at the second wet oxidation step is largely released.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

FIGS. 1A through 1G are schematic sectional views of a semiconductor device illustrating manufacturing steps of a First Embodiment according to the present invention;

DESCRIPTION OF THE PREFERRED EMBODIMENTS

[First Embodiment]

A first embodiment will be explained with reference to the accompanying drawings. In this embodiment, the present invention is adopted to a manufacturing of an N-channel type vertical type power MOSFET.

FIGS. 2A–2K are schematic sectional view illustrating manufacturing steps of the vertical type power MOSFET having a plurality of unit cells. The manufacturing steps will be briefly explained hereinafter with reference to FIGS. 2A–2K.

A semiconductor substrate 1 is made of an N-type silicon substrate 1a having (100) plane and a thickness of a range of approximately 500 to 600 μm, and an N-type epitaxial layer 1b grown on the N-type silicon substrate 1a and having a thickness of a range of approximately 5 to 30 μm. The silicon substrate 1a is highly doped by arsenic (As) ions so that a resistivity is set to or less than 0.006 Ω·cm. The epitaxial layer 1b is doped by phosphorus (P) ions with a concentration of a range of $1 \times 10^{14}$ to $5 \times 10^{16}$ cm$^{-3}$. A pad oxide film 3-a having a thickness of approximately 42.5 nm is formed on the N-type epitaxial layer 1b.

Figure 2A:
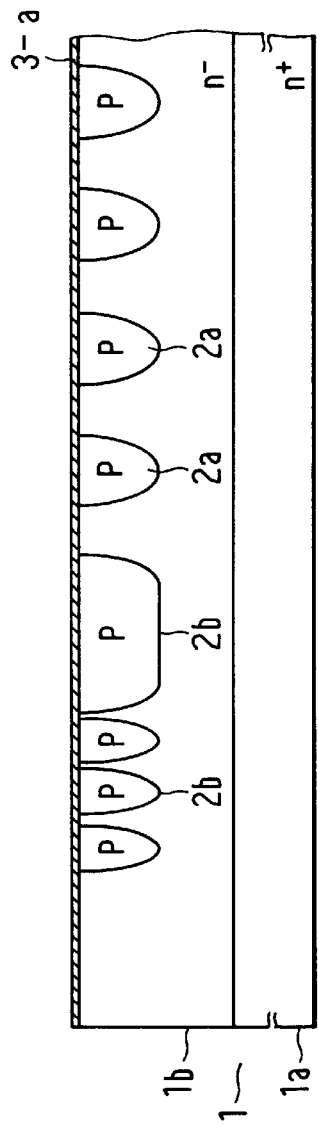
FIGS. 2A through 2K are schematic sectional views of a semiconductor device illustrating manufacturing steps of the First Embodiment according to the present invention.

At deep well forming step shown in FIG. 2A, a mask (for example, not-shown resist film) having openings at predetermined positions is formed on a main surface of the semiconductor substrate 1. After that, deep wells 2a, 2b having a predetermined impurity concentration (e.g., $10 \times 10^{16}$ cm$^{-3}$ order at a surface concentration) are formed in the semiconductor substrate 1 by implanting P-type impurities to the main surface of the semiconductor substrate 1 through the openings and performing an annealing process.

Here, the deep well 2a is regularly arranged in crosswise on the semiconductor substrate 1 so as to correspond the plurality of unit cells of the vertical type power MOSFET. The deep well 2a finally becomes a part of a channel well 7 (described later), and plays a roll to improve an anti-serge characteristic of the vertical type power MOSFET when a high voltage is applied between a drain and a source. The deep well 2b is formed in a ring shape at a peripheral portion of the semiconductor substrate 1 so as to surround a layout of unit cell of the vertical type power MOSFET, and used as a guardring for improving a withstand voltage.

Figure 2B:
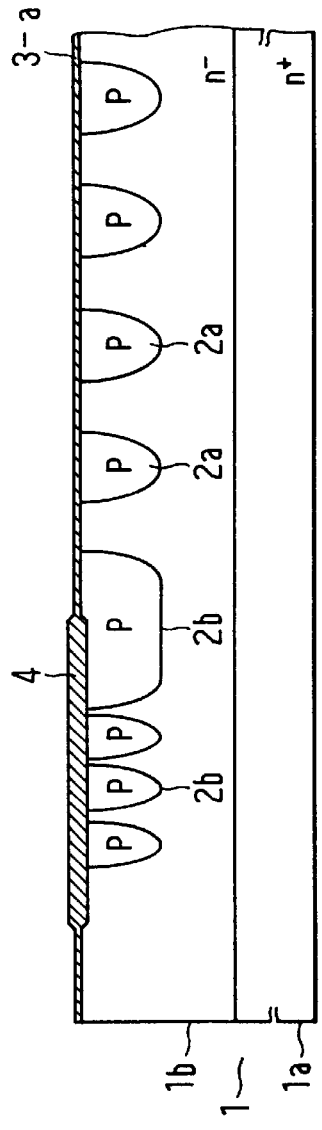

At LOCOS oxide film forming step shown in FIG. 2B, a LOCOS oxide film 4 is formed at a predetermined region on the semiconductor substrate 1 for insulating isolation by using a selectively oxidation method. In this figure, the LOCOS oxide film is formed only at a position corresponding to the deep well 2b, however, the LOCOS oxide film is formed at the other positions if necessary.

Figure 2C:
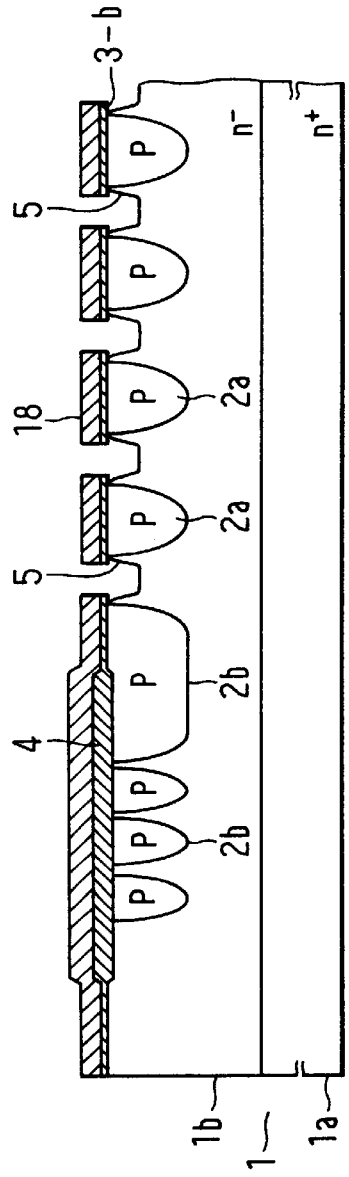
Figure 2D:
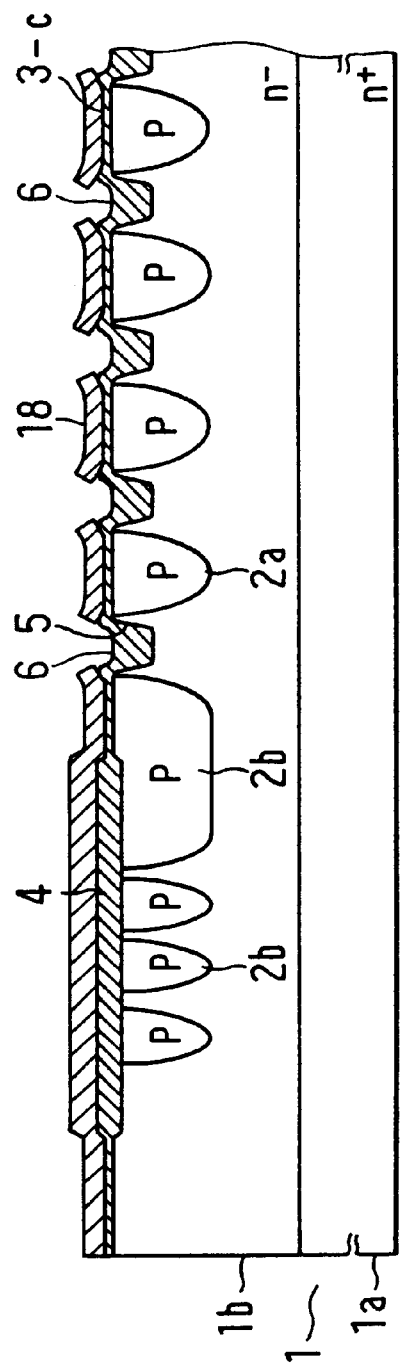

After that, groove forming step shown in FIG. 2C and oxide film forming step as shown in FIG. 2D are performed as channel region defining step.

At groove forming step shown in FIG. 2C, a silicon nitride film 18 having openings at predetermined regions is formed on the pad oxide film 3-a and the LOCOS oxide film 4. A groove portion 5 is formed by etching such as chemical dry etching or RIE (Reactive Ion Etching) through the openings of the silicon nitride film 18. The groove portion 5 is formed in a grid shape so as to surround each deep well 2a. The groove portion 5 is called "concave", and has a U-shaped section or bathtub section. Finally, rectangular vertical type power MOSFET cells, in which the channel region is defined at a sidewall of the concave structure, are formed by forming the grid shape plane pattern.

At oxide film forming step shown in FIG. 2D, a groove portion LOCOS oxide film 6 as a thick oxide film is formed in the groove portion 5 by oxidizing the side wall of the groove portion 5 using the silicon nitride film 18 as a mask. After that, the silicon nitride film 18 is removed. In these ways, the silicon nitride film 18 having the predetermined opening pattern is commonly used at both groove forming step shown in FIG. 2C and oxide film forming step as shown in FIG. 2D.

Figure 2E:
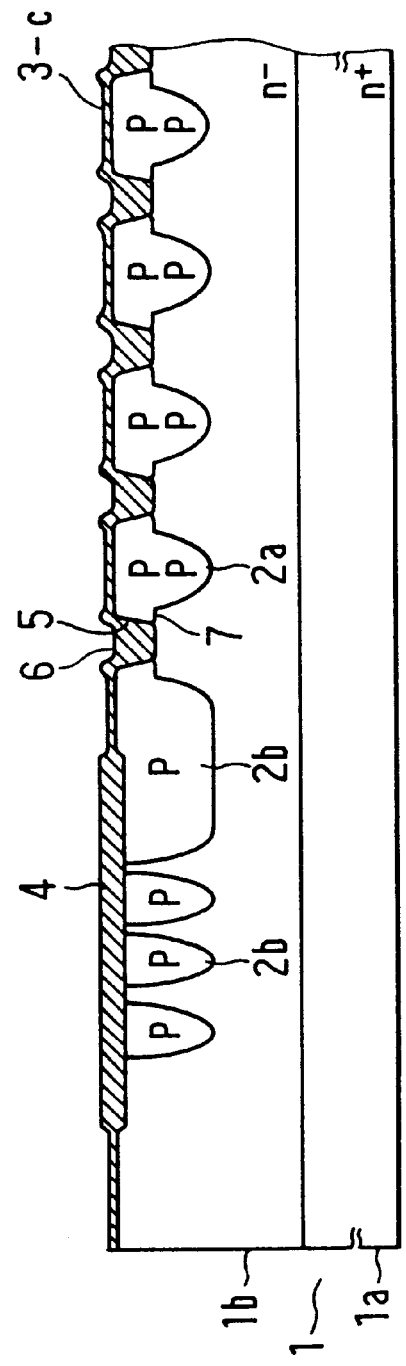

At channel well forming step shown in FIG. 2E, P-type impurities such as boron (B) are implanted to the semiconductor substrate 1 using the groove portion LOCOS oxide film 6 as a mask with a self-alignment. After that, the semiconductor substrate 1 is annealed. Accordingly, a channel well 7 integrated with the deep well 2a is formed at a region corresponding to each deep well 2a.

Figure 2F:
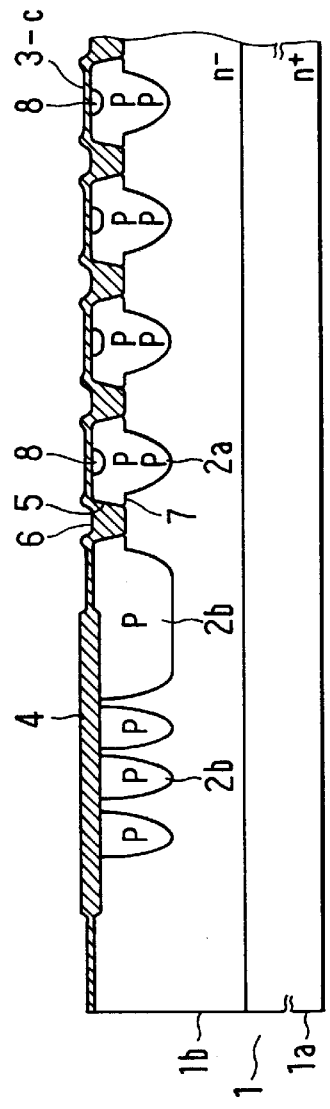

At contact layer forming step shown in FIG. 2F, a not-shown resist film having an opening at a center portion of the channel well 7 is formed on the semiconductor substrate 1. P-type impurities such as boron (B) ion are implanted to the semiconductor substrate using the resist film as a mask. Accordingly, a channel contact layer 8 having a high impurity concentration (e.g., $1 \times 10^{20}$ to $1 \times 10^{21}$ cm$^{-3}$ order at a surface concentration) is formed. After that, the resist film is removed.

Figure 2G:
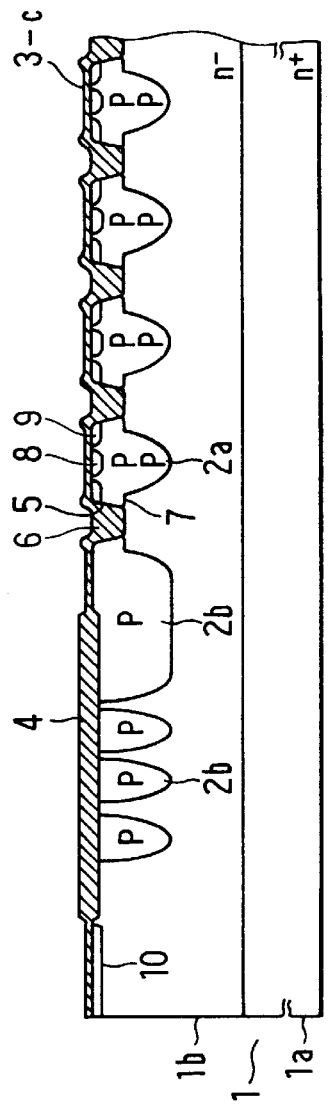

At source diffusion layer forming step shown in FIG. 2G, a not-shown resist film covering the channel contact layer 8 and having openings at channel well 7 closed to the groove portion 5 is formed on the semiconductor substrate 1. N-type impurities such as phosphorus (P) ion or arsenic (As) ion are implanted to the semiconductor substrate using the resist film as a mask. Accordingly, a source diffusion layer 9 and a channel stopper 10 having a high impurity concentration (e.g., $1 \times 10^{20}$ to $1 \times 10^{21}$ cm$^{-3}$ order at a surface concentration) are formed. After that, the resist film is removed. Accordingly, portions along to the sidewall of the groove portion 5 of the channel well 7 becomes an N-channel forming region where a channel is to be formed. Here, an self-alignment function of an ion implantation range and further of the channel region can be obtained by performing a double-diffusion using the groove portion LOCOS oxide film 6 as a mask.

Here, a plane orientation of the N-channel region can be set to {111} or {511} by the following ways, that is, by arranging the grid shape of the groove portion 5 at perpendicular or parallel to [011] direction of the surface of the semiconductor substrate 1 at step shown in FIG. 2C; and by adjusting an elevation angle of the sidewall of the groove portion LOCOS oxide film 6 by adequately selecting a groove depth and oxidation condition (oxidation thickness) at step shown in FIG. 2D.

Similarly, a plane orientation of the N-channel region can be set to {110} by arranging the grid shape of the groove portion 5 at perpendicular or parallel to [001] direction; and by adjusting an elevation angle.

Figure 2H:
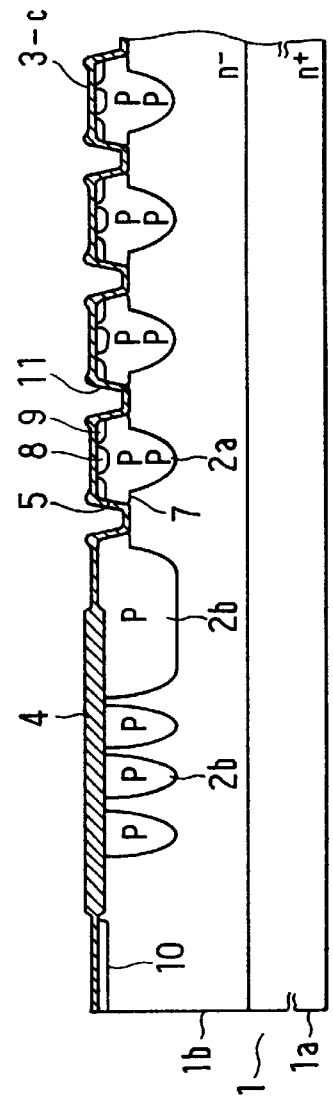

Next, at oxide film removing and gate oxide film forming step shown in FIG. 2H, a pad oxide film 3-c where corresponds to the groove portion LOCOS oxide film 6 and the channel well 7 are removed by etching such as wet etching. After that, a gate oxide film 11 having a thickness of, for example, approximately 60 nm, is formed on the removed region by thermal oxidation (dry oxidation) in a dried oxygen atmosphere. In this way, the gate oxide film 11 is formed along the side surface and bottom surface of the groove portion 5.

Figure 2I:
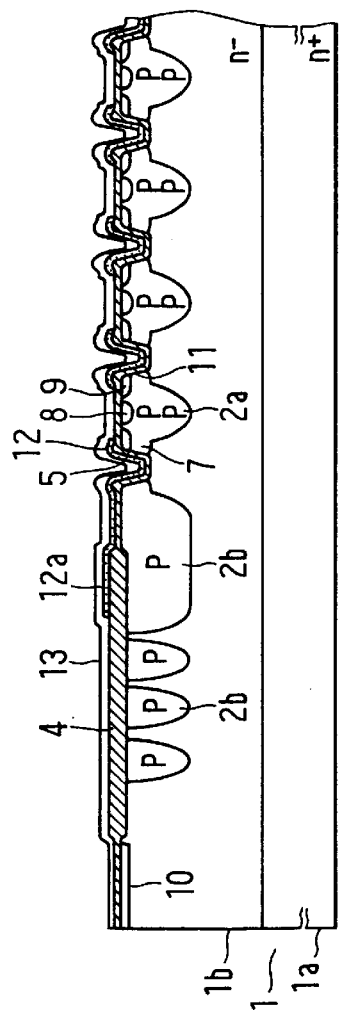

At polysilicon film forming and interlayer insulating film depositing step shown in FIG. 2I, a polysilicon film having a thickness of approximately 400 nm is deposited on the semiconductor substrate 1. The deposited polysilicon film is changed to low resistance by, for example, depositing phosphorus (P), and is patterned to a predetermined shape to form a continuous gate electrode 12. Furthermore, an interlayer insulating film 13 made of BPSG is deposited to cover the whole surface of the semiconductor substrate 1. Here, a terminal portion 12a, which extends onto the insulating isolation LOCOS oxide film 4, is integrally formed with the gate electrode 12 so as to electrically contact with the gate electrode 12.

Figure 2J:
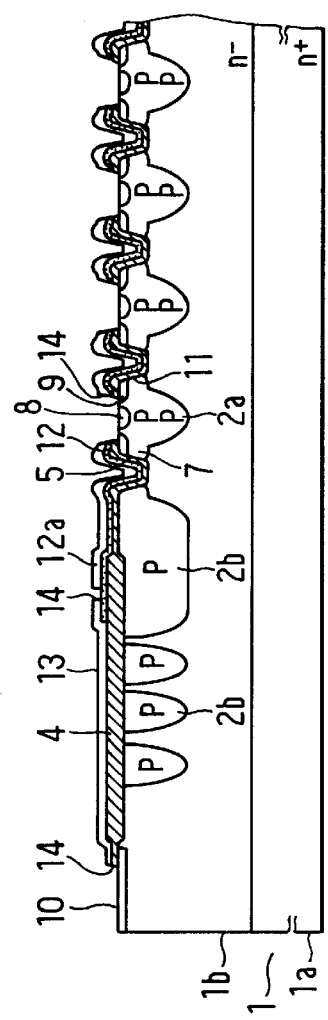

At contact hole forming step shown in FIG. 2J, the channel contact layer 8, the source diffusion layer 9, the terminal portion 12a of the gate electrode 12, channel stopper 10 are partly exposed by forming contact holes 14 at the interlayer insulating film 13 and so on.

Figure 2K:
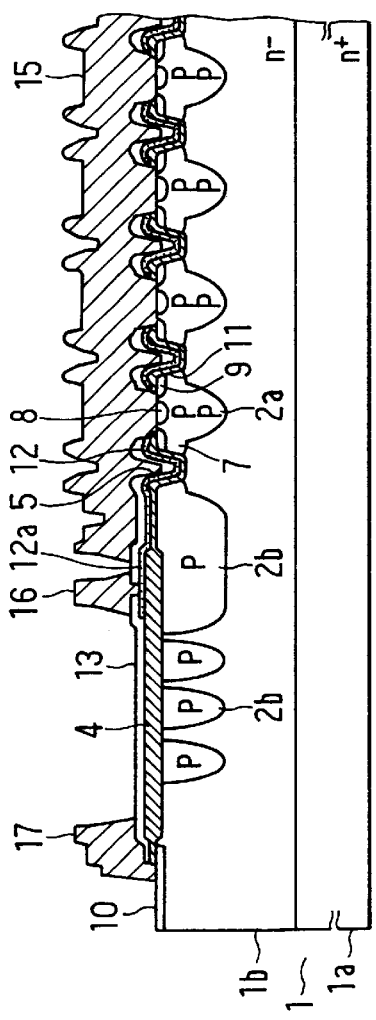

At surface electrode forming step shown in FIG. 2K, a source electrode film 15, a gate electrode film 16 and a channel stopper electrode film 17 are formed by so-called first aluminum. Each electrodes 15–17 are contacted to the channel contact layer 8, the source diffusion layer 9, the terminal portion 12a of the gate electrode 12 and the channel stopper 10, respectively, by an ohmic-contact through the contact holes 14.

After that, a not-shown passivation film for protecting the electrode films is deposited, and then a back surface of the semiconductor substrate 1 (back surface of the silicon substrate 1a) is ground. Finally, a back surface electrode (drain electrode) is formed on the ground back surface.

Here, FIGS. 1A through 1K are schematic sectional views of semiconductor substrate illustrating the groove portion forming step shown in FIG. 2C, the oxide film forming step shown in FIG. 2D and the other relating steps. Now, the groove portion forming step shown in FIG. 2C, the oxide film forming step shown in FIG. 2D will be explained in detail with reference to FIGS. 1A through 1K. Note that the groove portion forming step includes resist removing and oxide film forming step shown in FIG. 1D and silicon etching step shown in FIG. 1E. The oxide film forming step includes first wet oxidation step shown in FIG. 1F and second wet oxidation step shown in FIG. 1G. Here, nitride film depositing step shown in FIG. 1B and nitride film patterning step shown in FIG. 1C correspond to mask forming step of the present invention.

At low temperature oxidation step shown in FIG. 1A, a pad oxide film 3-b having a thickness of approximately 42.5 nm is formed on the main surface of the semiconductor substrate 1 (surface of the epitaxial layer 1b) by performing a thermal oxidation (wet oxidation) thereto in water vapor atmosphere. Here, a temperature of the thermal oxidation is relatively low temperature, for example approximately 875° C.

At nitride film depositing step shown in FIG. 1B, the silicon nitride ($Si_3N_4$) film 18 having a thickness of approximately 300 nm is formed on the pad oxide film 3-b.

At nitride film patterning step shown in FIG. 1C, a resist film 19 is deposited on the silicon nitride film 18. Opening 19a, which has a grid shape pattern corresponding region where the groove portion is to be formed, is formed by performing a photolithography to the resist 19. Next, opening 18a having a shape corresponding to the opening 19a is formed in the silicon nitride film 18. The silicon nitride 18 having the opening 18a performs as a mask member of the present invention. An opening width of each opening 18a is set smaller than that of groove portions 5 because the opening width of each groove portion is estimated to be enlarged.

At resist removing and oxide film etching step shown in FIG. 1D, after removing the resist film 19, the epitaxial layer 1b is partly exposed by performing wet etching to the pad oxide film 3-b using the silicon nitride film 18 as a mask.

Figure 1E:
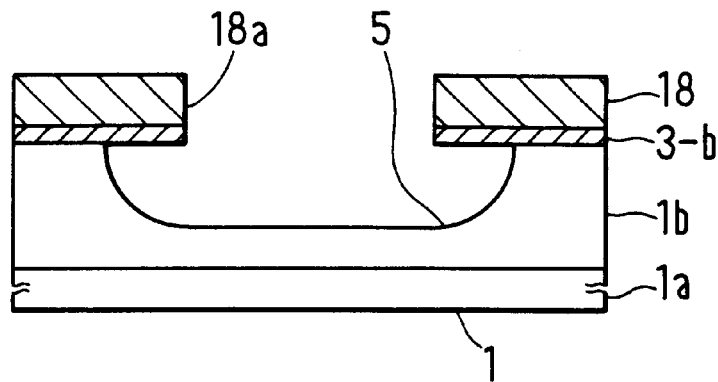

Next, silicon etching step shown in FIG. 1E is performed. In this embodiment, the groove portion is formed in the epitaxial layer 1b to have a depth of approximately 1.6 $\mu$m by isotropic chemical dry etching using the silicon nitride film 18 as a mask. Since the isotropic etching is performed by the chemical dry etching, the groove portion is formed to have an opening portion wider than that of opening 18a of the silicon nitride film 18 as the mask. This chemical dry etching is performed by using, for example, ($CF_4+O_2$) based gas.

Here, in this embodiment, the resist film 19 is removed before the pad oxide film 3-b is wet-etched, however, the pad oxide film-b may be used as a mask in the chemical dry etching for forming the groove portion 5.

Figure 1F:
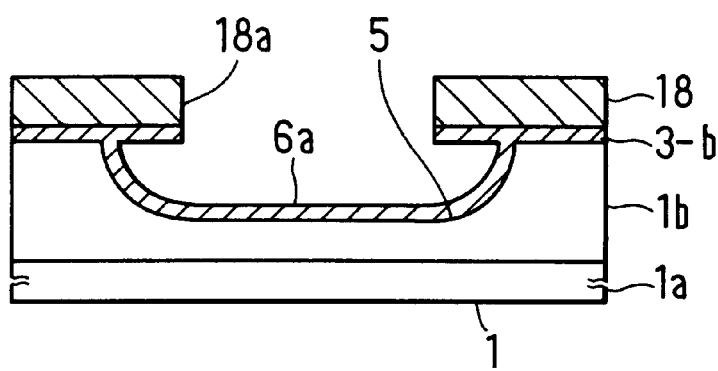

At first wet oxidation step shown in FIG. 1F, a thin oxide film 6a having a thickness of approximately 42.5 nm is formed on the exposed surface of the epitaxial layer 1b (surface of the groove portion 5) by performing wet oxidation (thermal oxidation in water vapor atmosphere) thereto at a relatively low temperature (less than 1000° C., preferably between 800 and 900° C.). In this embodiment, the oxidation temperature is set to, for example, approximately 875° C.

Figure 1G:
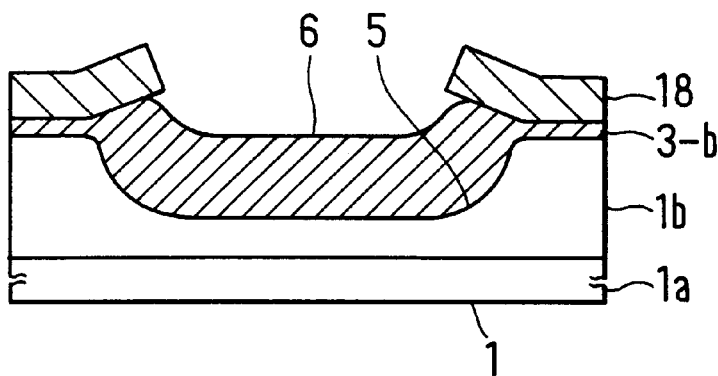

At second wet oxidation step shown in FIG. 1G, the oxidation temperature is risen up to relatively high temperature (between 1000 and 1200° C., preferably equal to or less than 1100° C.), for example, approximately 1050° C. in order to advance the oxidation of the epitaxial layer 1b. That is, second wet oxidation step oxidizes the surface of the thin oxide film 6a. Finally, the groove portion LOCOS oxide film 6 having a thickness of approximately 950 nm is formed as the result of second wet oxidation step. After that, the silicon nitride film 18 is removed by etching using thermal phosphoric acid.

According to the method of manufacturing of the vertical power MOSFET of this embodiment, the oxide film forming step for forming the groove portion LOCOS oxide film 6 in the groove portion 5 includes a plurality of wet oxidation steps, that is, the first wet oxidation step shown in FIG. 1F for performing the wet oxidation at the relatively low oxidation temperature (for example, approximately 875° C.); and the second wet oxidation step shown in FIG. 1G for performing the wet oxidation at the relatively high oxidation temperature (for example, approximately 1050° C.).

Figure 3:
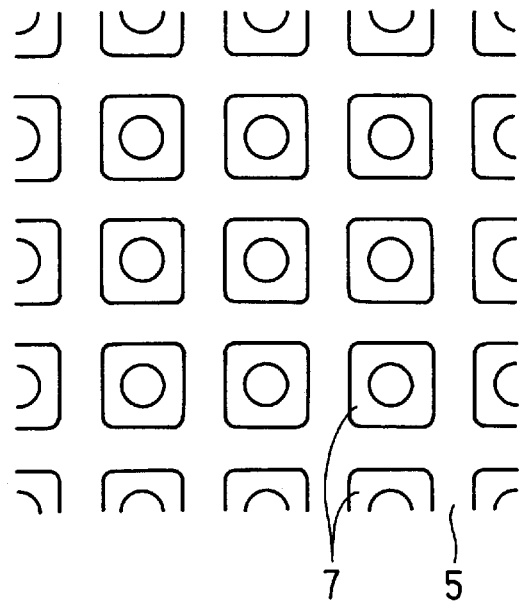
FIG. 3 is a partial plan view of a semiconductor substrate illustrating a result of lattice defects estimation in the First Embodiment.
Figure 7:
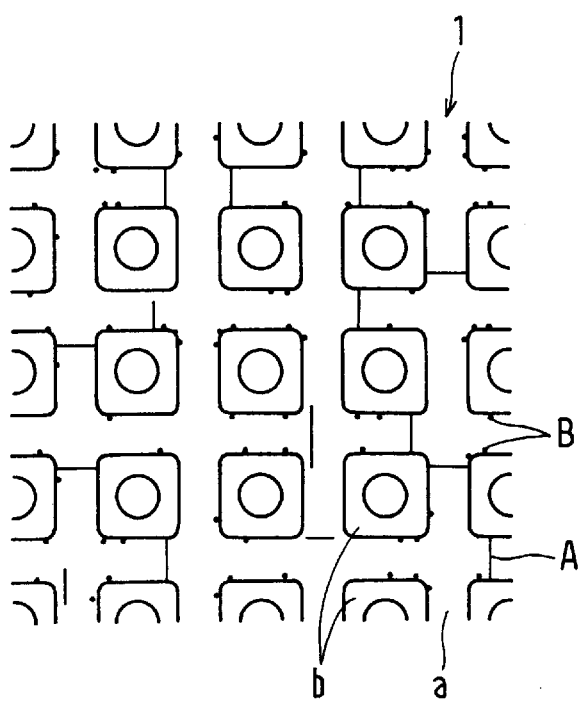
FIG. 7 is a partial plan view of a semiconductor substrate illustrating a result of lattice defects estimation in a related art.

In this way, when the groove portion LOCOS oxide film 6 is formed in the groove portion 5 on the semiconductor substrate 1, this embodiment adopts plural of oxidation processes. That is, after forming the thin oxide film 6a having a thickness of approximately 42.5 nm by performing a preliminary wet oxidation at the oxidation temperature of approximately 875° C., the groove portion LOCOS film 6 having a thickness of approximately 950 nm is formed by performing a substantial wet oxidation at the oxidation temperature of approximately 1050° C. According to the estimation of the lattice defects of the semiconductor substrate 1, it is found that the lattice defects due to the dislocation caused by thermal stress dramatically decreases (see FIG. 3) compared to that of the related art shown in FIG. 7. Here, FIG. 3 is a schematic diagram showing a photograph of the surface of the semiconductor substrate wherein the Secco etching is performed on the surface of the semiconductor substrate. In this specimen, the OSF is restrained by taking measures against the heavy-metals pollution. It is thought that this reduction of the lattice defects due to the dislocation is caused by largely releasing the thermal stress generated at the semiconductor substrate 1 portion corresponding to the edges of the groove portion LOCOS oxide film 6. Accordingly, the yield of manufacturing the vertical type MOSFET can largely improve by performing the oxide film forming process by the wet etchings and adjusting the oxidation temperature in two steps.

According to the method of manufacturing of this embodiment, since the mask member (silicon nitride film 18) used for forming the groove portion 5 to the semiconductor substrate 1 can be directly used as the mask for forming the groove portion LOCOS oxide film 6 at the oxide film forming step, the method itself can be simplified. Furthermore, at the silicon etching step shown in FIG. 1E, which is one step of the groove portion forming step, the groove portion 5 is formed to have the opening portion wider than that of opening 18a of the silicon nitride film 18 by performing the isotropic chemical dry etching using the silicon nitride film 18 as the mask, the following effects can be obtained. That is, since a sharp corner at upper end of an opening portion of the groove portion 5 is rounded off as a result of the isotropic dray etching, a concentration of the electric field at the corner of the upper end of the groove portion 5 can be released. Accordingly, it can restrain a decreasing of a lifetime of the gate electrode 12 formed along the sidewall of the groove portion 5. Furthermore, since the chemical dray etching has a high controllability, a high reproducibility, and less damage against the surface to be etched, it can reduce surface defects of the groove portion 5 and can improve electric characteristic at the channel region to be formed at the sidewall.

[Second Embodiment]

FIGS. 4A through 4I are schematic sectional views of a semiconductor device illustrating manufacturing steps of a Second Embodiment, which has modified steps against the First Embodiment. Steps different from the First Embodiment will be mainly explained.

That is, at steps shown in FIGS. 4A through 4E, the low temperature oxidation step, the nitride film depositing step, the nitride film patterning step, the resist removing and oxide film etching step, and the silicon etching step shown in FIGS. 1A through 1E are performed as well.

Figure 4A:
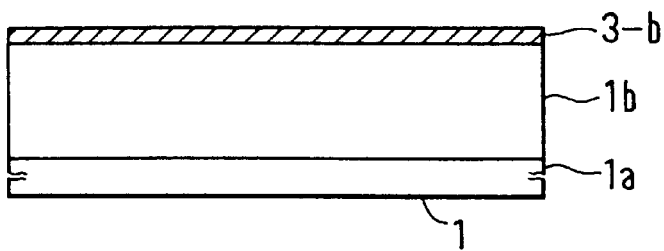
FIGS. 4A through 4I are schematic sectional views of a semiconductor device illustrating manufacturing steps of a Second Embodiment according to the present invention.
Figure 4B:
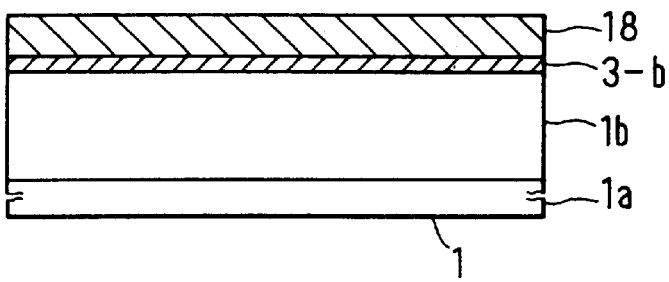
Figure 4C:
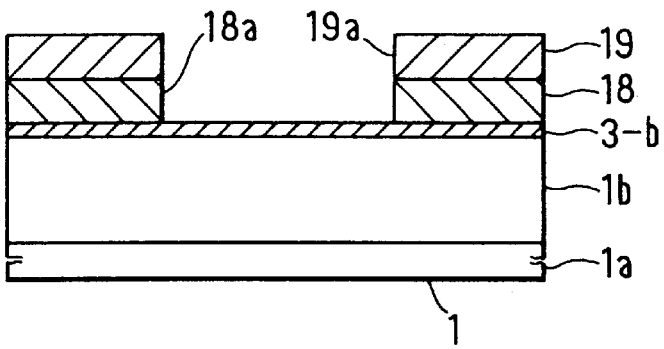
Figure 4D:
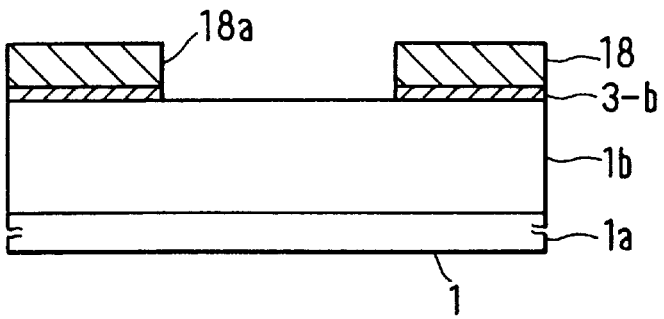
Figure 4E:
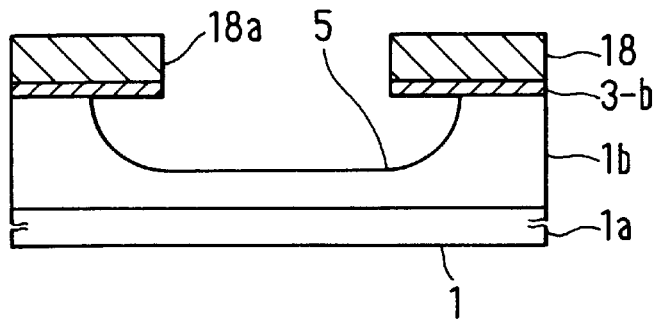
Figure 4F:
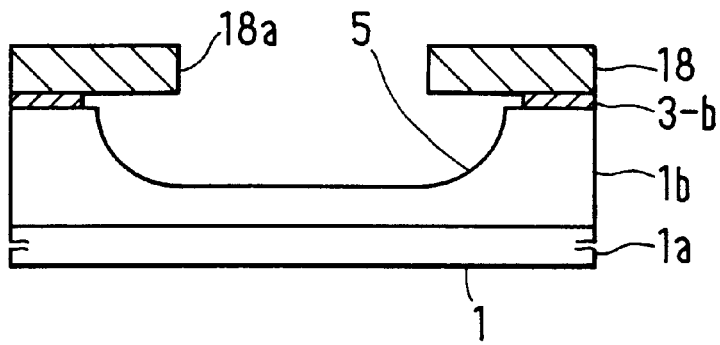

At oxide film etching step shown in FIG. 4F, wet etching is performed to the pad oxide film 3-b by using the silicon nitride film 18 as a mask so that the pad oxide film 3-b is backed off by a predetermined distance from the upper end of the opening portion of the groove portion 5 in order to enlarge an opening width of the opening portion.

Figure 4G:
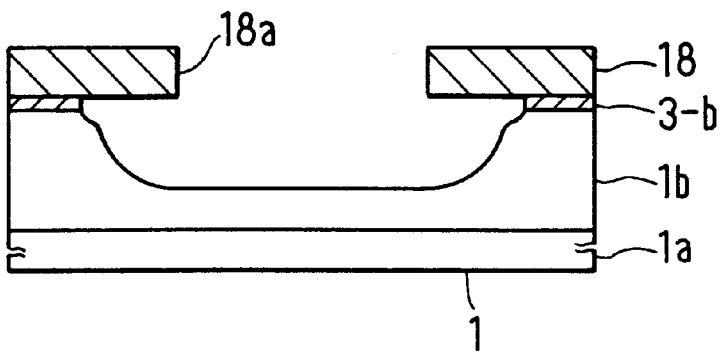

At auxiliary etching step shown in FIG. 4G, the isotropic chemical dry etching the same as that in the silicon etching step shown in FIG. 4E is performed to the epitaxial layer 1b to round off the sharp corner at the upper end of the groove portion 5 of the epitaxial layer 1b.

Figure 4H:
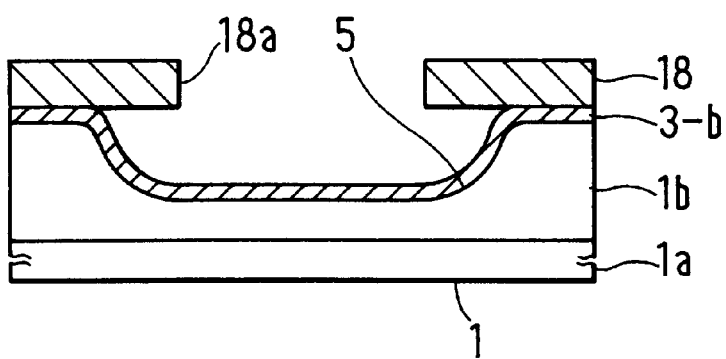
Figure 4I:
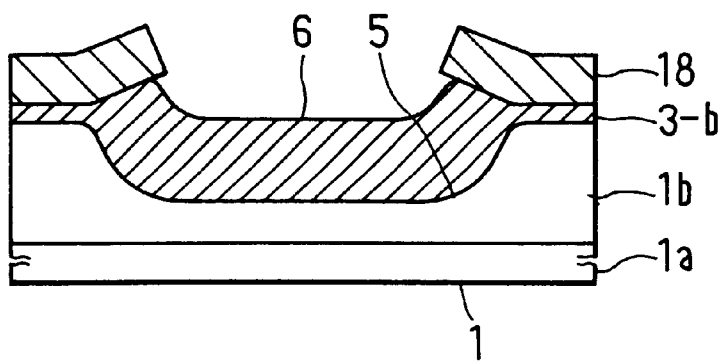

After that, first wet oxidation step shown in FIG. 4H is performed by the same way as the first wet oxidation step shown in FIG. 1F to form a thin oxide film on inner sidewall of the groove portion 5. Furthermore, second wet oxidation step shown in FIG. 4I is performed by the same way as the second wet oxidation step shown in FIG. 1G to form a thick groove portion LOCOS oxide film 6.

According to this method of manufacturing, since the sharp corner at the upper end of the groove portion 5 is rounded off at the auxiliary etching step, a concentration of the electric field at the corner of the upper end of the groove portion 5 can be further released compared with the first embodiment. Accordingly, it can further restrain a decreasing of a lifetime of the gate electrode 12 formed along the sidewall of the groove portion 5.

[Third Embodiment]

In the first and the second embodiments, it is preferable to continuously perform the first wet oxidation step and the second wet oxidation step in the common reactor. In this embodiment, a concrete oxidation procedure where the first wet oxidation step and the second wet oxidation step in the common reactor, and where the groove portion LOCOS oxide film having a thickness of approximately 950 nm is formed will be explained.

Figure 5:
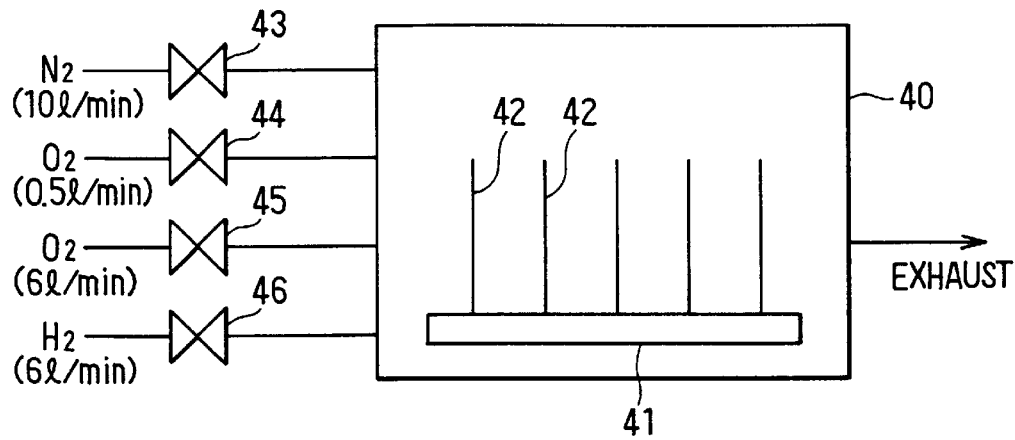
FIG. 5 is a schematic diagram illustrating a thermal oxidation process of a Third Embodiment according to the present invention.

As shown in FIG. 5, a wafer 42 is set on a board 41, and is loaded into an oxidation reactor 40. Here, nitrogen ($N_2$) gas can be supplied to the oxidation reactor 40 by 10 litters per minutes through a valve 43. Similarly, oxygen ($O_2$) gas can be supplied to the oxidation reactor 40 by 0.5 litters per minutes and 0.6 litters per minutes through valves 44, 45, and hydrogen ($H_2$) gas can be supplied to the oxidation reactor 40 by 6 litters per minutes through valve 46.

Figure 6A:
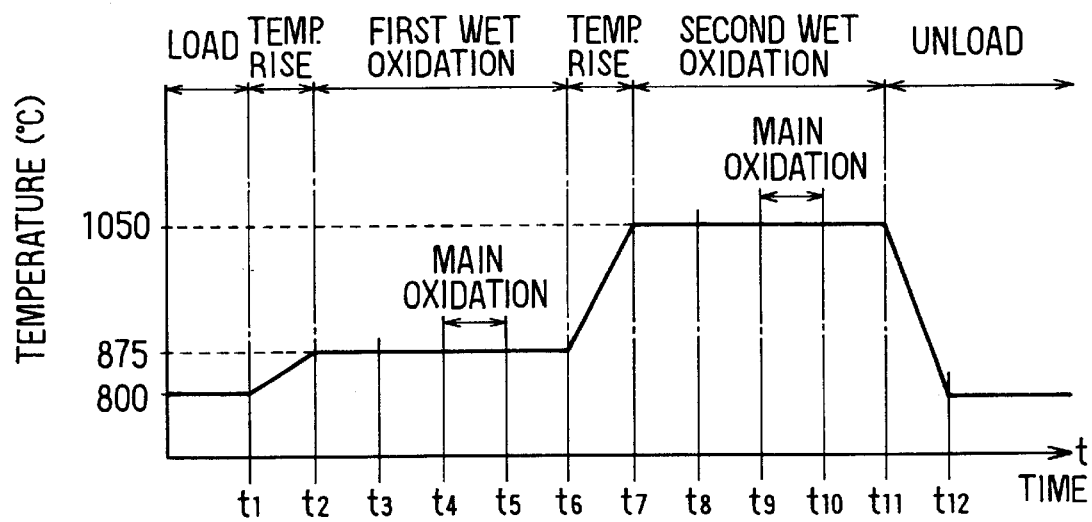
FIGS. 6A, 6B are timing charts illustrating relationships between time and temperature, and between time and gas flow.
Figure 6B:
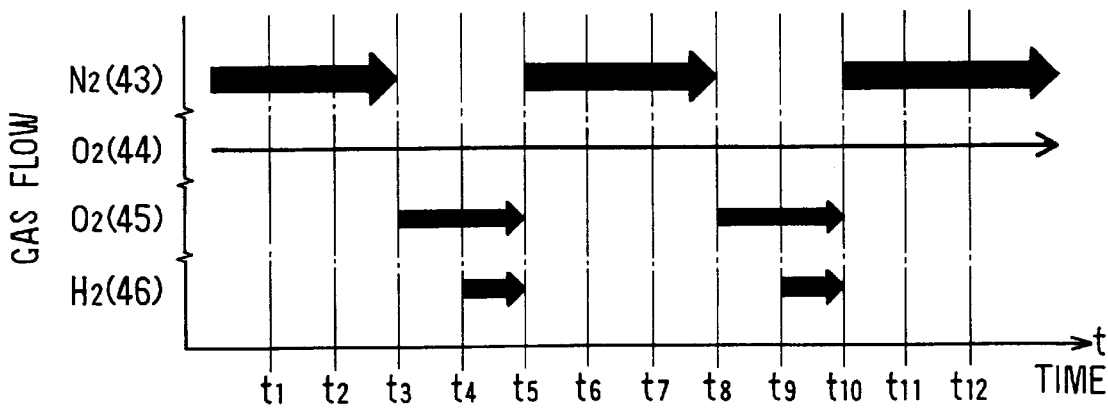

At first, both the nitrogen ($N_2$) and the oxygen ($O_2$) are supplied to the oxidation reactor 40 through the valves 43, 44 as shown in FIG. 6B. At the same time, a temperature in the oxidation reactor is risen up as shown in FIG. 6A.

That is, as shown in FIGS. 6A, 6B, before a timing $t_1$, the oxidation reactor temperature is set to a predetermined temperature (e.g., 800° C.), the nitrogen ($N_2$) and the oxygen ($O_2$) are supplied to the oxidation reactor 40 so that the oxygen ($O_2$) ratio with respect to the nitrogen ($N_2$) is to or less than 5% (in this embodiment, the ratio is equal to 5%).

From the timing $t_1$, the oxidation reactor temperature is risen so that the oxidation reactor temperature becomes 800–1000° C. (e.g., 875° C.) at a timing $t_2$ by a rising speed of, for example, 10° C. per minute, with keeping the gas flows described the above.

From the timing $t_2$ to the timing $t_3$, the wafer 42 is annealed for approximately 10 minutes with keeping the oxidation reactor temperature being 800–1000° C. (e.g., 875° C.) and keeping the supplying oxygen being ratio of to or less than 5%.

After that, at the timing $t_3$, the supply of the nitrogen ($N_2$) is stopped, and the oxygen ($O_2$) is introduced to the oxidation reactor 40 through the valves 44, 45. This introduction of the oxygen ($O_2$) is kept until an atmosphere in the oxidation reactor 40 is stable (e.g., for 5 minutes).

At a timing $t_4$, a main oxidation of the preliminary first wet oxidation step starts by starting supplying the hydrogen ($H_2$) through the valve 46. This first wet oxidation step is performed, for example, for 30 minutes.

At a timing $t_5$, the oxygen ($O_2$) through the valve 45 and the hydrogen ($H_2$) through the valve 46 are stopped, the nitrogen ($N_2$) is restarted to flow and the oxygen ($O_2$) through the valve 44 is maintained in order to control the oxygen ($O_2$) ratio with respect to the nitrogen ($N_2$) being to or less than 5% (e.g., 5%).

From a timing t₆, the oxidation reactor temperature is risen up so that the oxidation reactor temperature becomes 1000–1200° C. (e.g., 1050° C.) at a timing t₇ by a rising speed of, for example, 10° C. per minute, with keeping the gas flows described the above.

From the timing t₇ to a timing t₈, the wafer 42 is annealed for approximately 10 minutes with keeping the oxidation reactor temperature being 1000–1200° C. (e.g., 1050° C.) and keeping the supplying oxygen being ratio of to or less than 5%.

After that, at the timing t₈, the supply of the nitrogen (N₂) is stopped, and the oxygen (O₂) is introduced to the oxidation reactor 40 through the valves 44, 45. This introduction of the oxygen (O₂) is kept until an atmosphere in the oxidation reactor 40 is stable (e.g., for 5 minutes).

At a timing t₉, a main oxidation of the substantial wet oxidation step starts by starting supplying the hydrogen (H₂) through the valve 46. This second wet oxidation step is performed, for example, for 250 minutes.

At a timing t₁₀, the oxygen (O₂) through the valve 45 and the hydrogen (H₂) through the valve 46 are stopped, the nitrogen (N₂) is restarted to flow and the oxygen (O₂) through the valve 44 is maintained in order to control the oxygen (O₂) ratio with respect to the nitrogen (N₂) being to or less than 5% (e.g., 5%).

From a timing t₁₁, the oxidation reactor temperature is fallen down so that the oxidation reactor temperature becomes 800° C. at a timing t₁₂ by a falling speed of, for example, -3° C. per minute, with keeping the gas flows described the above.

After a timing t₁₂, the wafer 42 is unloaded from the oxidation reactor 40 after cooled down.

In this way, the lattice defects caused at the LOCOS oxidation process can also be prevented from generation when the first and the second wet oxidation steps are performed in the common oxidation reactor 40. This method is practically preferable.

Here, the oxygen (O₂) is supplied to the oxidation reactor with the nitrogen (N₂) as an inert gas so that the ratio of the oxygen (O₂) with respect to the inert gas is set to or less than 5% while the oxidation temperature is risen and stable, in advance of each main oxidation of the first and second wet oxidation steps. It can prevent a surface of the silicon substrate or oxide film from being unexpectedly nitrided at where a nitride film should not be formed, and from roughening. Furthermore, since a preliminary anneal is performed with oxidation by supplying a little amount of oxygen, small defects, which are formed on the surface of the substrate at the former steps such as the deep well forming step or the groove forming step using the chemical dry etching, are incorporated into the oxide film as the oxide film grows up. Accordingly, it can restrain the OSF due to a volume expansion as a result of growing of the oxide film at the main oxidation from generation. Furthermore, when the oxygen is introduced in the gas atmosphere, it can prevent the pollution from the nitrogen atmosphere from being incorporated because the oxygen acts as a getter of gettering. Here, when the wafer 42 is inserted (loaded) into the oxidation reactor 40, air is also likely to be introduced into the oxidation reactor 40 and causes the pollution, however, this inconvenient can be prevented by the oxygen as the getter.

Here, in this embodiment, the oxygen (O₂) is supplied to the oxidation reactor as well as the nitrogen (N₂) (inert gas) at both during the temperature rising and during a predetermined period constant temperature annealing before main oxidation, however, the oxygen (O₂) may be supplied to the oxidation reactor with the nitrogen (N₂) (inert gas) at only one of during the temperature rising and during a predetermined period constant temperature annealing before main oxidation. Furthermore, the nitrogen (N₂) gas including some percentages of the oxygen is used as the inert gas, however, Ar, Ne, He may be used as the inert gas instead of the nitrogen (N₂).

[Modified Embodiment]

In the first to the third embodiments are explained with reference to the N-channel type vertical power MOSFET, however, the present invention can be adopted to a method of manufacturing of a P-channel type vertical power MOSFET, a power IGBT, a MOS element having the same channel structure, an LDMOS or an up-drain type DMOS. In the groove portion forming step, the isotropic chemical dry etching is used, however, the other etching method such as the RIE or wet etching can be used instead.

What is claimed is:

1. A method of manufacturing a vertical type power MOSFET comprising:

forming a mask having an opening at a predetermined area on a surface of a semiconductor substrate;

forming a thin oxide film on the semiconductor substrate by oxidizing the semiconductor substrate through the opening of the mask by a wet thermal oxidation at a first oxidation temperature;

growing the thin oxide film to a thick oxide film thicker than the thin oxide film by further oxidizing the semiconductor substrate through the opening of the mask by a wet thermal oxidation at a second oxidation temperature higher than the first oxidation temperature;

implanting impurities through the thick oxide film to form a source region in the semiconductor substrate and a channel region at the semiconductor substrate where the thick oxide film is formed;

forming a groove portion to expose the channel region by etching the thick oxide film; and forming a gate electrode, a source electrode and a drain electrode.

2. A method of manufacturing a vertical type power MOSFET according to claim 1, including selecting the first oxidation temperature from a range of 800° C. to 1000° C., and selecting the second oxidation temperature from a range of 1000° C., and selecting the second oxidation temperature from a range of 1000° C. to 1100° C.

3. A method of manufacturing a vertical type power MOSFET according to claim 1, further comprising:

before forming said thin oxide film, rising a temperature of the semiconductor substrate to the first oxidation temperature in an atmosphere where an inert gas including oxygen is being supplied.

4. A method of manufacturing a vertical type power MOSFET according to claim 3, including supplying the oxygen with respect to the inert gas at a ratio equal to or less than 5%.

5. A method of manufacturing a vertical type power MOSFET according to claim 1, further comprising before said growing of the thin oxide film, rising a temperature of the semiconductor substrate from the first oxidation temperature to the second oxidation temperature in an atmosphere where an inert gas including oxygen is being supplied.

6. A method of manufacturing a vertical type power MOSFET according to claim 5, including supplying the oxygen with respect to the inert gas to or less than 5%.

7. A method of manufacturing a vertical type power MOSFET according to claim 1, including forming the groove portion so that a sidewall of the groove portion where the channel region is formed becomes one of {111} plane, {511} plane and {110} plane.

8. A method of manufacturing a vertical type power MOSFET according to claim 1, further comprising:

before forming said oxide film, forming an initial groove in the semiconductor substrate by etching the semiconductor substrate through the opening of the mask, wherein forming and growing the thin oxide film oxidize a surface of the initial groove through the opening of the mask.

9. A method of manufacturing a vertical type power MOSFET according to claim 8, including forming the initial groove by isotropic chemical dry etching so that a opening width of the initial groove is larger than that of the opening of the mask.

10. A method of manufacturing a vertical type power MOSFET according to claim 8, further comprising:

performing preliminary etching, between forming said initial groove and forming said thin oxide film for rounding off a corner at an upper end of an opening portion of the initial groove by etching the initial groove through the opening of the mask.

11. A method of manufacturing a vertical type power MOSFET according to claim 1, performing said forming and growing of the thin oxide film continuously in a common oxidation reactor.

12. A method as in claim 1 including selecting the first oxidation temperature at less than 1000° C. And selecting the second oxidation temperature at more than 1000° C.

13. A method of manufacturing a vertical type power MOSFET according to claim 1, wherein forming the thin oxide film is conducted subsequent to forming the masking having the opening.

14. A method of manufacturing a vertical type power MOSFET according to claim 1, wherein growing the semiconductor substrate is conducted subsequent to forming the mask having the opening.

15. A method of manufacturing a vertical type power MOSFET comprising:

forming a mask having an opening at a predetermined area on a surface of a semiconductor substrate;

first oxidizing the semiconductor substrate through the opening of the mask by a wet thermal oxidation at a first oxidation temperature to form a thin oxide film on the semiconductor substrate;

second oxidizing the semiconductor substrate through the opening of the mask by a wet thermal oxidation at a second oxidation temperature higher than the first oxidation temperature to grow said thin oxide film to a thick oxide film thicker than said thin oxide film; and defining a channel of a MOS structure on a surface of the semiconductor substrate at which said thick oxide film having been formed.

16. A method of manufacturing a vertical type power MOSFET according to claim 15, after forming the mask, further comprising:

forming an initial groove on the semiconductor substrate through the opening of the mask, wherein the first oxide film and the second oxide film are formed in the initial groove, and the channel of the MOS structure is defined on the surface of the semiconductor substrate at which corresponding to the initial groove after the second oxide film is formed on the initial groove.

17. A method of manufacturing a vertical type power MOSFET according to claim 1, wherein a growth rate of the thick oxide film is greater than that of the thin oxide.

18. A method of manufacturing a vertical type power MOSFET according to claim 15, wherein a growth rate of the thick oxide film is greater than that of the thin oxide film.

19. A method of manufacturing a vertical type power MOSFET according to claim 15, wherein first oxidizing the semiconductor substrate is conducted subsequent to forming the mask having the opening.

20. A method of manufacturing a vertical type power MOSFET according to claim 15, wherein second oxidizing the semiconductor substrate is conducted subsequent to first oxidizing the semiconductor substrate.

* * * * *